(12) United States Patent
Iino

(10) Patent No.: US 9,882,107 B2
(45) Date of Patent: Jan. 30, 2018

(54) LED PACKAGE WITH COVERED BONDING WIRE

(71) Applicants: CITIZEN ELECTRONICS CO., LTD., Fujiyoshida-shi, Yamanashi (JP); CITIZEN WATCH CO., LTD., Tokyo (JP)

(72) Inventor: Takashi Iino, Fuefuki (JP)

(73) Assignees: CITIZEN ELECTRONICS CO., LTD., Yamanashi (JP); CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 15/404,630

(22) Filed: Jan. 12, 2017

(65) Prior Publication Data

US 2017/0200876 A1 Jul. 13, 2017

(30) Foreign Application Priority Data

Jan. 12, 2016 (JP) .................................. 2016-003663
Dec. 28, 2016 (JP) .................................. 2016-257016

(51) Int. Cl.
*H01L 33/00* (2010.01)
*H01L 33/62* (2010.01)
*H01L 33/50* (2010.01)
*H01L 33/56* (2010.01)
*H01L 23/00* (2006.01)

(52) U.S. Cl.
CPC .............. *H01L 33/62* (2013.01); *H01L 24/45* (2013.01); *H01L 33/502* (2013.01); *H01L 33/56* (2013.01); *H01L 2224/45139* (2013.01); *H01L 2224/45144* (2013.01); *H01L 2224/45687* (2013.01); *H01L 2924/05442* (2013.01); *H01L 2924/12041* (2013.01)

(58) Field of Classification Search
CPC ................................ H01L 33/62; H01L 24/45
USPC ........................................................... 257/98
See application file for complete search history.

(56) References Cited

U.S. PATENT DOCUMENTS

| 2004/0104391 | A1* | 6/2004 | Maeda | C09K 11/025 257/79 |
| 2004/0135504 | A1* | 7/2004 | Tamaki | C01B 21/0602 313/512 |
| 2007/0259206 | A1* | 11/2007 | Oshio | C04B 35/581 428/690 |
| 2008/0036375 | A1* | 2/2008 | Zheng | C09K 11/584 313/509 |

(Continued)

FOREIGN PATENT DOCUMENTS

| JP | 01251727 A | 10/1989 |
| JP | 2000195892 A | 7/2000 |

*Primary Examiner* — Jami M Valentine
(74) *Attorney, Agent, or Firm* — RatnerPrestia

(57) ABSTRACT

Provided is an LED package which is unlikely to cause the attenuation of emitted light from an LED element by bonding wires for electrical connection of the LED element. The LED package includes a board including a pair of connection electrodes formed thereon, an LED element mounted on the board, a bonding wire electrically connecting the LED element to the pair of connection electrodes, and a covering layer containing a phosphor and covering the bonding wire, wherein the phosphor is excited by emitted light from the LED element to emit light having an absorbance in the bonding wire lower than that of the emitted light and a wavelength longer than that of the emitted light.

11 Claims, 8 Drawing Sheets

(56) References Cited

U.S. PATENT DOCUMENTS

| | | | |
|---|---|---|---|
| 2009/0140630 A1* | 6/2009 | Kijima | C09K 11/661 313/498 |
| 2010/0013373 A1* | 1/2010 | Hata | H01L 33/504 313/502 |
| 2010/0230691 A1* | 9/2010 | Inoue | C09K 11/7734 257/98 |
| 2011/0114360 A1* | 5/2011 | Hermes | H01B 7/36 174/112 |
| 2011/0186868 A1* | 8/2011 | Watari | H01L 24/49 257/88 |
| 2013/0037323 A1* | 2/2013 | Smith | H01B 7/36 174/75 R |
| 2014/0035211 A1* | 2/2014 | Bailey | F16F 1/06 267/166 |
| 2014/0054634 A1* | 2/2014 | Fukuda | C09K 11/7734 257/98 |

* cited by examiner

LED PACKAGE WITH COVERED BONDING WIRE

CROSS REFERENCE TO RELATED APPLICATION

This application is a new U.S. patent application that claims benefit of JP2016-3663, filed on Jan. 12, 2016, and JP2016-257016, filed on Dec. 28, 2016. The entire contents of JP2016-3663 and JP2016-257016 are hereby incorporated by reference.

TECHNICAL FIELD

The present invention relates to an LED package.

BACKGROUND ART

Japanese Unexamined Patent Publication (Kokai) No. H01-251727 describes a bonding wire for semiconductor elements which includes a copper wire or a copper alloy wire, an insulating layer and a covering layer having anticorrosive properties, formed on the surface of the wire, and a lubricating layer formed on the covering layer, in order to prevent short-circuiting between bonding wires.

A surface-mounting light-emitting apparatus (LED package) including an LED (light-emitting diode) element mounted on a board is known. Such an LED package, in which the LED element is sealed with a translucent resin containing a phosphor, yields white light among others, according to application, by mixing of light from the LED element and light yielded by the phosphor excited by the light from the LED element.

SUMMARY

In the surface-mounting LED package in which connection electrodes on a board and an LED element are electrically connected by wire bonding, light emitted from the LED element is likely to be absorbed by bonding wires, leading to lowering of the intensity of the emitted light from the LED element.

FIG. 8 is a graph indicating spectral reflectance of metal materials. In FIG. 8, the horizontal axis λ (nm) represents wavelength and the vertical axis R (%) represents reflectance. FIG. 8 indicates reflection spectra in the wavelength range of 200 to 1,000 nm for four metallic materials, i.e., Ag (silver), Al (aluminum), Au (gold), and Cu (copper).

For example, in the case of Au, the reflectance is about 95% for red light having a wavelength of about 650 nm, but for light in the range from blue having a wavelength of about 450 nm or less to ultraviolet, the reflectance is as low as 40%. For this reason, for example, when a blue LED is used as the LED element and a gold wire is used as the bonding wire, blue light from the LED element is easily absorbed by the gold wire, and therefore, the blue light in the LED package is attenuated. This also applies to, for example, a case in which an LED element emitting purple light is used or a case in which a copper wire is used as the bonding wire. Therefore, some combinations of the emission wavelength of an LED element and a metal material for the bonding wire may cause decrease in the intensity of the light emitted from the LED element due to absorption by the bonding wire.

It is therefore an object of the present invention to provide an LED package which is unlikely to cause the attenuation of emitted light from an LED element by bonding wires for electrical connection of the LED element.

Provided is an LED package including a board including a pair of connection electrodes formed thereon, an LED element mounted on the board, a bonding wire electrically connecting the LED element to the pair of connection electrodes, and a covering layer containing a phosphor and covering the bonding wire, wherein the phosphor is excited by emitted light from the LED element to emit light having an absorbance in the bonding wire lower than that of the emitted light and a wavelength longer than that of the emitted light.

Preferably, the above LED package further includes a sealing resin which contains a second phosphor excited by the emitted light to emit second light, and which integrally seals the LED element, the bonding wire, and the covering Layer, wherein the phosphor in the covering layer emits light having a wavelength longer than, that of the second light.

Preferably, the above LED package further includes a board-covering layer which contains a third phosphor and covers a conductive pattern on the board, wherein the third phosphor is excited by the emitted light to emit light having an absorbance in the conductive pattern lower than that of the emitted light and a wavelength longer than those of the emitted light and the second light.

Preferably, in the above LED package, the LED element is an element emitting blue light as the emitted light, the bonding wire is a gold wire made of gold, and the phosphor in the covering, layer is a phosphor emitting red light.

Preferably, the above LED package further includes a protective layer which covers a surface of the bonding wire and, prevents the bonding wire from corrosion, wherein the covering layer covers the protective layer.

Preferably, the above LED package further includes a protective layer which covers a surface of the covering layer and prevents the bonding wire from corrosion.

Preferably, in the above LED package, a lower half portion of the protective layer, closer to the board and the LED element, is made of a material having a refractive index lower than that of the sealing resin.

Preferably, in the above LED package, the protective layer is made of silicon dioxide, and the bonding wire is made of silver.

The above LED package is unlikely to cause the attenuation of emitted light from an LED element by bonding wires for electrical connection of the LED element.

BRIEF DESCRIPTION OF THE DRAWINGS

Other features and advantages of the present invention will be apparent from the ensuing description, taken in conjunction with the accompanying drawings, in which.

DESCRIPTION

Hereinafter, with reference to the accompanying drawings, an LED package will be explained in detail. However, it should be noted that the present invention is not limited to the drawings or the embodiments described below.

Figure 1:
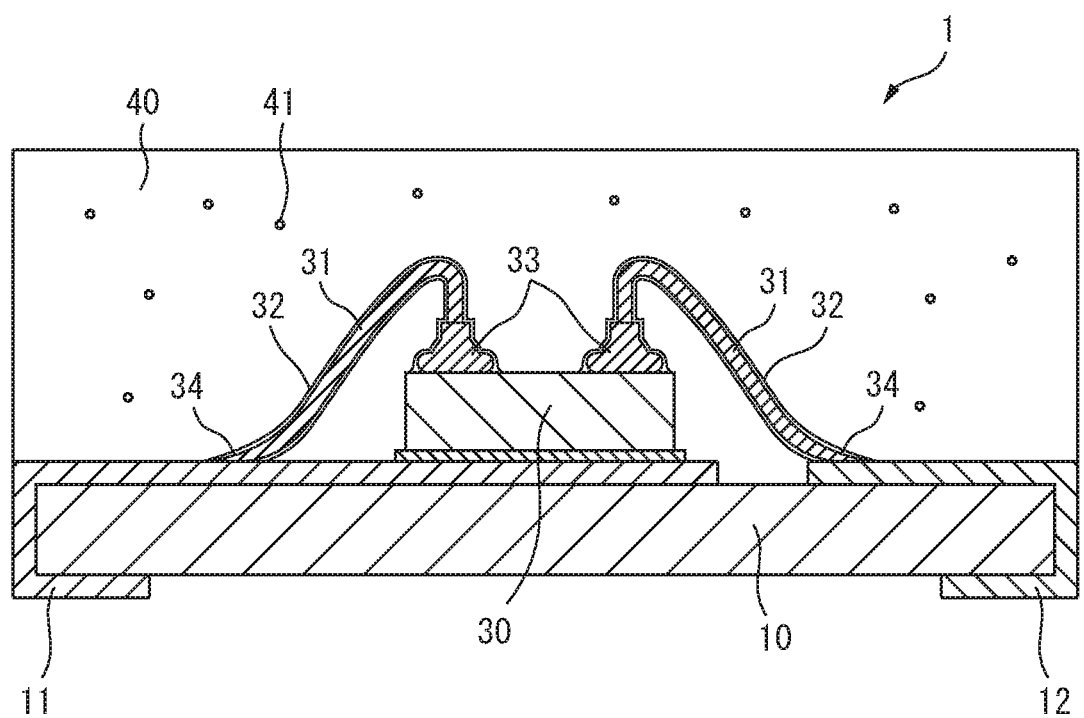
FIG. 1 is a vertical cross-sectional view of an LED package 1.

FIG. 1 is a vertical cross-sectional view of an LED package 1. The LED package 1 includes a board 10, an LED element 30, and a sealing resin 40. The LED package 1 is a surface-mounting light-emitting device in which the LED element 30 is mounted on the board 10 and sealed with the sealing resin 40 containing a phosphor.

The board 10 is an insulating board including a pair of connection electrodes 11 and 12 formed on the upper surface thereof. In the illustrated example, the connection electrode 11 is at the left end of the board 10, and the connection electrode 12 is at the right end of the board 10, each extending from the upper surface of the board 10 to the back surface thereof. A voltage applied across the connection electrode 11 and the connection electrode 12 induces light emission by the LED element 30.

The LED element 30 is, for example, an LED element such as a gallium nitride-based compound semiconductor which emits light having a wavelength in an ultraviolet to blue region. Hereinafter, the LED element 30 is assumed to be a blue LED element which emits blue light having an emission wavelength band, for example, from about 450 to 460 nm. However, the LED element 30 may be an element that emits light having another wavelength such as violet light and ultraviolet light. The LED element 30 is mounted on the upper surface of the board 10 and is electrically connected to the connection electrodes 11 and 12 on the board 10 by two bonding wires (hereinafter simply referred to as "wires 31").

The wires 31 electrically connect the LED element 30 to the pair of connection electrodes 11 and 12. In the following description, the wires 31 are described as cold wires made of gold, but the material for the wires 31 may be another metal such as silver, copper, and aluminum. One end of the respective wires 31 is connected to respective two element electrodes formed on the upper surface of the LED element 30 at respective two connection portions 33 by, for example, ball bonding. The other end of the respective wires 31 is connected to the upper surface of the respective connection electrodes 11 and 12 at respective two connection portions 34 by, for example, wedge bonding. Further, a covering layer 32 is provided on the surface of each wire 31.

The covering layer 32 is made of, for example, a red phosphor or a resin containing a red phosphor, and covers the surface of the wires 31. The red phosphor is a particulate phosphor material such as $CaAlSiN_3:Eu^{2+}$, which absorbs blue light emitted from the LED element 30 and converts the wavelength of the light to that of red light.

The sealing resin 40 is a translucent resin such as an epoxy resin and a silicone resin containing a yellow phosphor such as YAG (Yttrium Aluminum Garnet) dispersed and mixed therein. The sealing resin 40 integrally seals the LED element 30, the wires 31, and the covering layer 32 as a whole. Unlike the illustrated example, for example, a frame body having an upward opening may be disposed on the board 10 so as to enclose the periphery of the LED element 30, and the LED element 30, the wires 31 and the covering layer 32 may be sealed with a translucent resin filled in a concave portion formed by the frame body.

The yellow phosphor in the sealing resin 40 is an example of a second phosphor, and is excited by light emitted from the LED element 30, to emit yellow light as second light. In FIG. 1, particles of this yellow phosphor are indicated by a reference numeral 41. The LED package 1 mainly emits white light generated by mixing of blue light from the LED element 30, i.e., a blue LED, and yellow light yielded by the yellow phosphor excited by the blue light.

Figure 8:
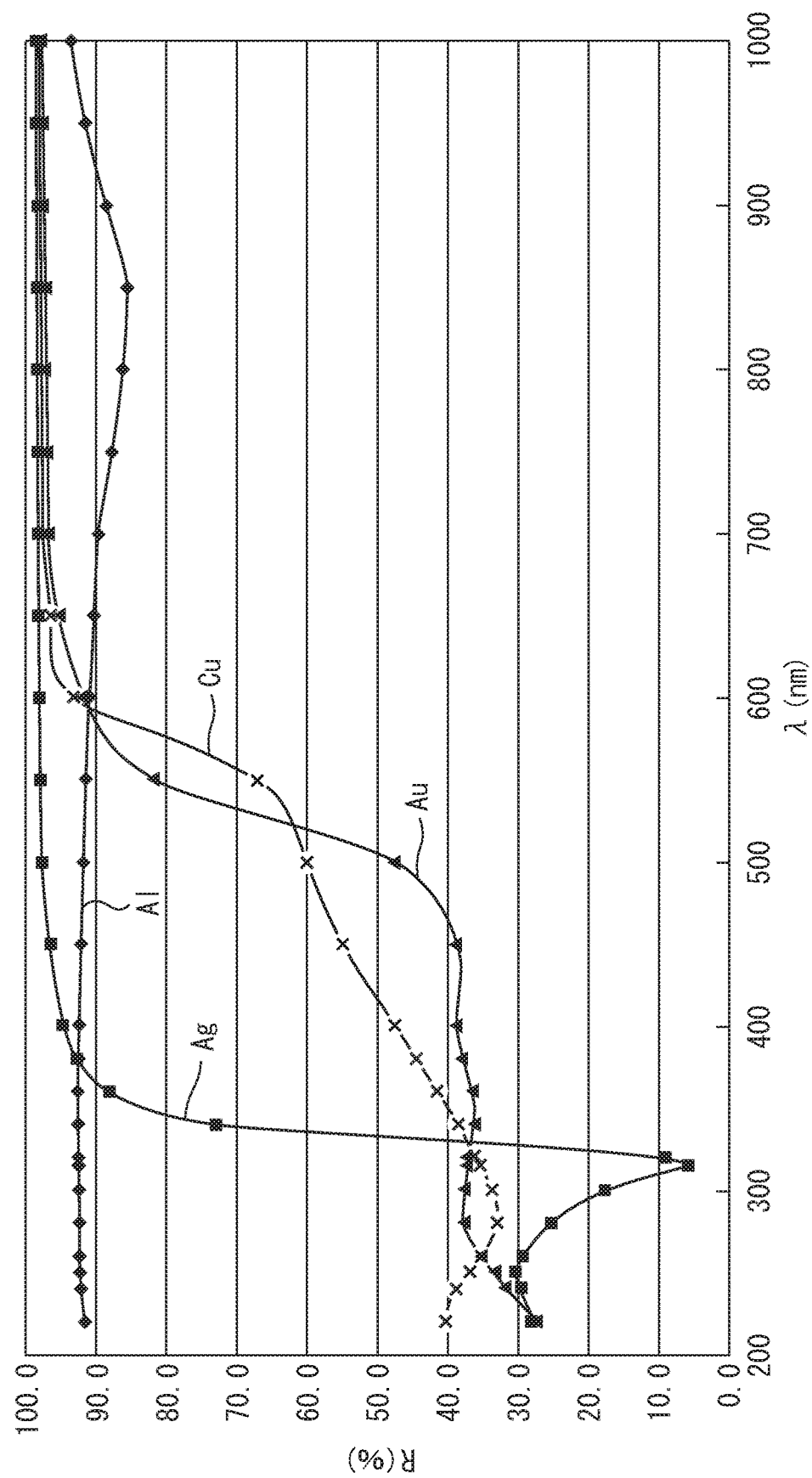
FIG. 8 is a graph indicating spectral reflectance of metal materials.

The red phosphor in the covering layer 32 is excited by blue light emitted from the LED element 30 to emit red light. Since Au has a higher reflectance for red light than for blue light, as explained with reference to FIG. 8, its absorbance is lower for red light than for blue light. Therefore, red light is light which has lower absorbance in the gold wires 31 than blue light and has a longer wavelength than blue light.

In the LED package 1, blue light from the LED element 30 is transformed to red light which hard to be absorbed, through wavelength-conversion by the red phosphor in the covering layer 32 provided on the surface of the wires 31 before being absorbed by the gold wires 31. Therefore, in the LED package 1, the attenuation of light due to absorption by the wires 31 is smaller than a package without the covering layer 32.

Since Au has a higher reflectance for yellow light than for blue light and a lower absorbance for yellow light than for blue light, the covering layer 32 may be formed of a yellow phosphor or a resin containing a yellow phosphor. However, the phosphor in the covering layer 32 is preferably a red phosphor which emits light having a longer wavelength than that of the light of the yellow phosphor in the sealing resin 40. In other words, the phosphor in the covering layer 32 is preferably a phosphor different from that in the sealing resin 40 or a resin containing a phosphor different therefrom, and preferably emits light having a longer wavelength than that of light emitted from the phosphor in the sealing resin 40.

The wires 31, when covered with a phosphor which emits light having a longer wavelength than that of both the light emitted from the LED element 30 and the light from the phosphor in the sealing resin 40, hardly absorb not only the light emitted from the LED element 30 but also that from the phosphor in the sealing, resin 40. Therefore, in the LED package 1, the attenuation of light due to absorption by the wires 31 is lowered in comparison to a package using wires 31 cowered with a phosphor which emits light having a shorter wavelength than that of the light emitted from the phosphor in the sealing resin 40.

For improvement in the color rendering property, more than one, for example, two phosphors such as yellow and red phosphors may be mixed and dispersed in the sealing resin 40. Alternatively, a red phosphor may be used in both of the covering layer 32 and the sealing resin 40. In particular, direct application of the red phosphor to the wires 31 instead of its dispersion in the sealing resin 40 enables emission of light from the LED element 30 without any loss of the light.

Figure 2A:
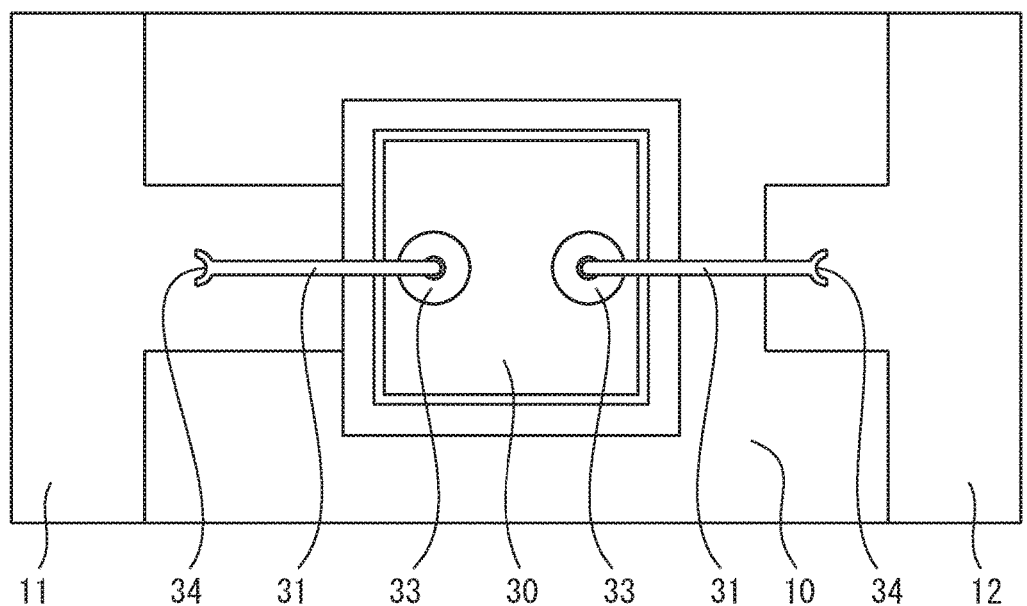
FIG. 2A is a top view illustrating steps of producing the LED package 1.
Figure 2B:
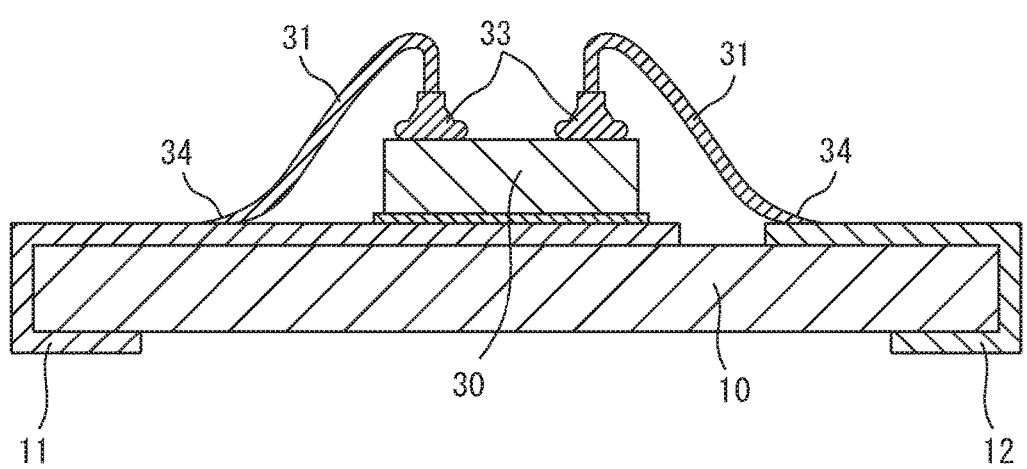
FIG. 2B is a vertical cross-sectional view corresponding to FIG. 2A.
Figure 3A:
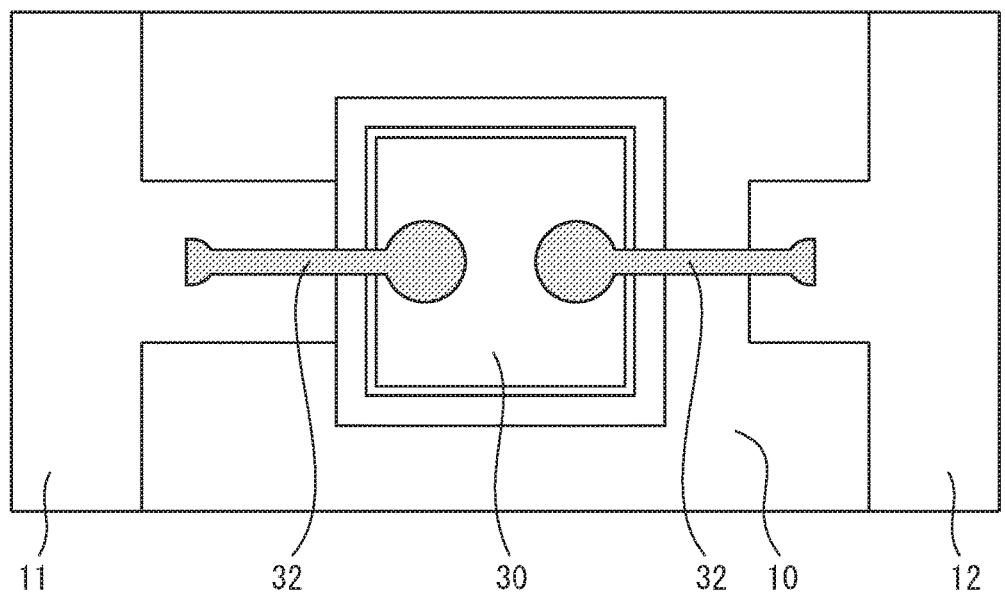
FIG. 3A is a to view illustrating steps of producing the LED package 1.
Figure 3B:
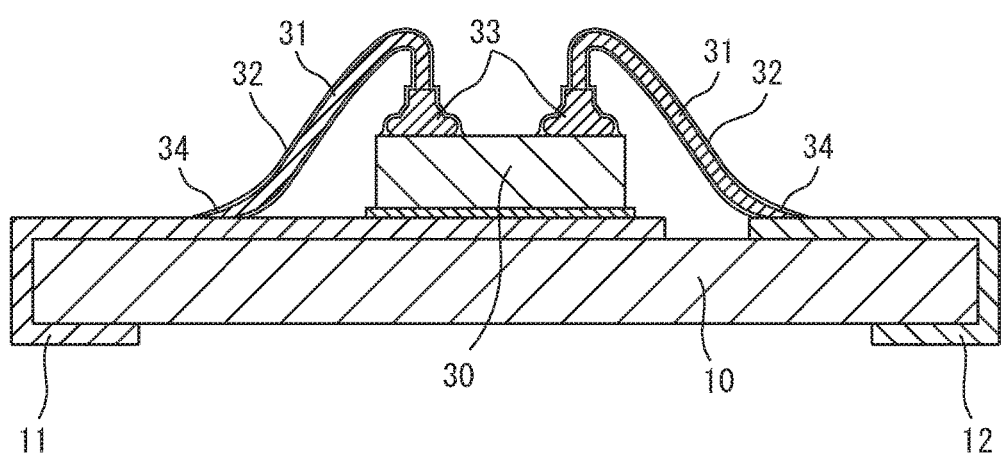
FIG. 3B is a vertical cross-sectional view corresponding to FIG. 3A.

FIGS. 2A and 3A are top views illustrating steps of producing the LED package 1. FIGS. 2B and 3B are vertical cross-sectional views corresponding to FIGS. 2A and 3A, respectively.

When the LED package 1 is produced, an LED element 30 is first mounted on the upper surface of a board 10 having connection electrodes 11 and 12. Next, as illustrated in FIGS. 2A and 2B, respective two element electrodes of the LED element 30 and the connection electrodes 11 and 12 are connected by two wires 31 at connection portions 33 and 34.

Subsequently, as illustrated in FIGS. 3A and 3B, a covering layer 32 is formed on the surfaces of the two wires 31 by using, for example, a red phosphor or a resin containing a red phosphor. In this instance, when the size of the LED package 1 is particularly small, the covering layer 32 may be formed, for example, by dropping the red phosphor. However, the covering layer 32 is preferably formed to be thin so that the red phosphor in the covering layer 32 may not form lumps where emitted red light becomes conspicuous. The covering, layer 32 is formed after wire bonding, because its formation before the bonding causes its melting during the bonding.

Then, the LED element 30, the wires 31, and the covering layer 32 are integrally sealed with the sealing resin 40 containing a yellow phosphor dispersed and mixed therein, and thus, the LED package 1 illustrated in FIG. 1 is completed.

Figure 4:
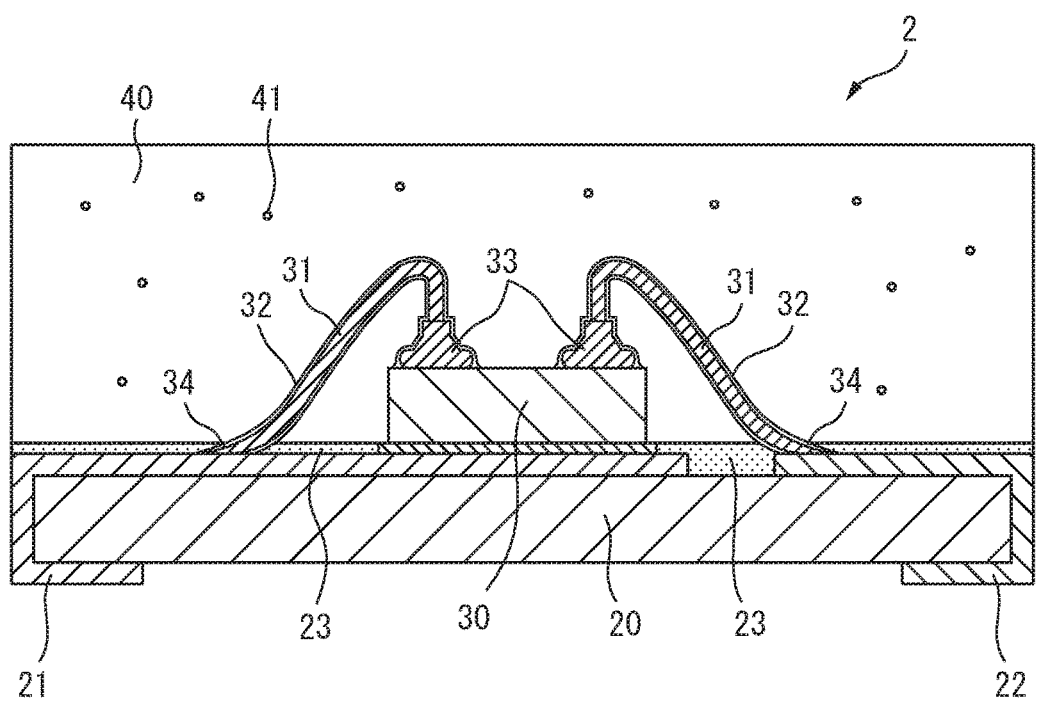
FIG. 4 is a vertical cross-sectional view of another LED package 2.

FIG. 4 is a vertical cross-sectional view of another LED package 2. The LED package 2 includes a board 20, an LED element 30, and a sealing, resin 40. Since the LED package 2 has the same configuration as that of the LED package 1 except for the board different from that of the LED package 1, differences of the LED package 2 from the LED package 1 will be described below.

The board 20 is an insulating board having a pair of connection electrodes 21 and 22 formed on the upper surface thereof. The surface of the connection electrodes 21 and 22 is plated with, for example, Au. In the cross-sectional view of FIG. 4, the shapes of the connection electrodes 21 and 22 are the same as those of the connection electrodes 11 and 12 of the LED package 1, but as can be seen by comparing FIG. 2A with FIG. 5A which will be described later, the connection electrodes 21 and 22 covers wider areas of the upper surface of the board 20 than the connection electrodes 11 and 12 do. Further, in the LED package 2, a board-covering layer 23 is provided on a portion other than the LED element 30 of the upper surface of the board 20.

The board-covering layer 23 is made of, for example, a red phosphor or a resin containing a red phosphor, and covers the connection electrodes 21 and 22 which are conductive patterns on the upper surface of the board 20. The red phosphor in the board-covering layer 23 is an example of a third phosphor, and is excited by light emitted from the LED element 30 to emit red light as third light. This red light has a lower absorbance in the conductive patterns plated with Au than the blue light, i.e., the light emitted from the LED element 30, and has a longer wavelength than the emitted light and the yellow light emitted from the yellow phosphor in the sealing resin 40.

When most of the upper surface of the board 20 is covered with the connection electrodes 21 and 22 of the board 20 plated with Au, light may be attenuated due to absorption by not only the wires 31 but also the Au plating on the board 20. However, in the LED package 2, the blue light from the LED element 30 is transformed to hardly absorbed red light through wavelength-conversion by the red phosphor in the board-cowering layer 23 provided on the upper surface of the board 20, before being absorbed by the conductive patterns on the board 20. Therefore, in the LED package 2, the attenuation or light due to absorption in the conductive patterns on the board 20 is reduced as compared with a package without the board-covering layer 23.

The board-covering layer 23 may also be formed of a yellow phosphor or a resin containing a yellow phosphor. Further, different phosphors may be used for the board-covering layer 23 and the covering layer 32. For example, a red phosphor and a yellow phosphor may be used for the board-covering layer 23 and the covering layer 32, respectively, or a yellow phosphor and a red phosphor may be used for the board-covering layer 23 and the covering layer 32, respectively. However, the phosphor in the board-covering layer 23 is preferably a red phosphor which emits light having a longer wavelength than that of light emitted from yellow phosphor in the sealing resin 40. In other words, the phosphor in the board-covering layer 23 is preferably a phosphor different from that in the sealing resin 40 or a resin containing a phosphor different therefrom, and preferably emits light having a longer wavelength than that of light emitted from the phosphor in the sealing resin 40.

When the conductive patterns on the board 20 are covered with a phosphor emitting light having a longer wavelength than that of both light emitted from the LED element 30 and light emitted from the phosphor in the sealing resin 40, the conductive patterns hardly absorb not only the light emitted from the LED element 30 but also that from the phosphor in the sealing resin 40. Therefore, in the LED package 2, the attenuation of light due to absorption in the conductive patterns decreases as compared with a package with conductive patterns on the board 20 which are covered with a phosphor that emits light having a shorter wavelength than that of the light emitted from the phosphor in the sealing resin. 40.

Figure 5A:
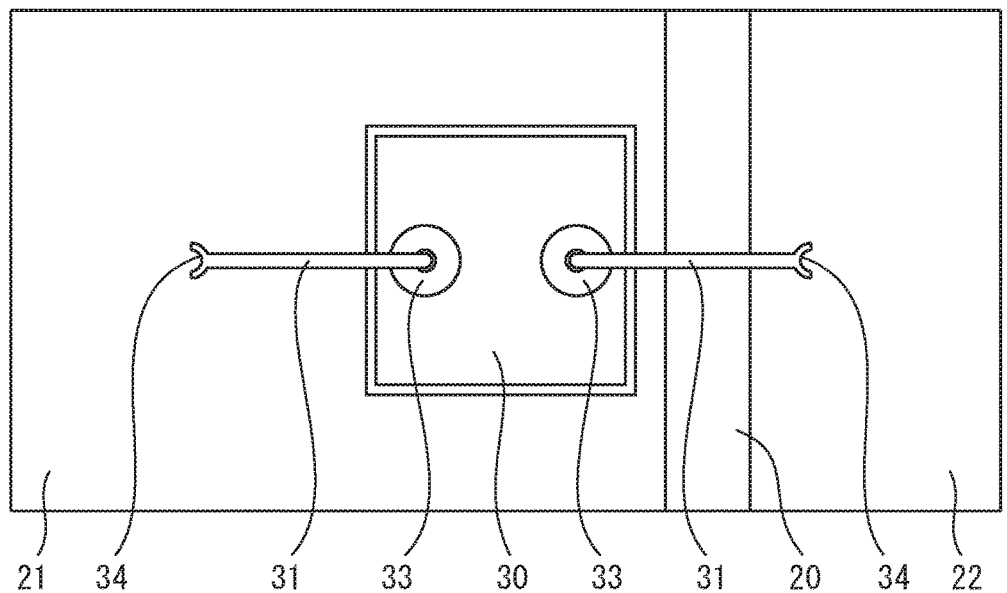
FIG. 5A is a top view illustrating steps of producing the LED package 2.
Figure 5B:
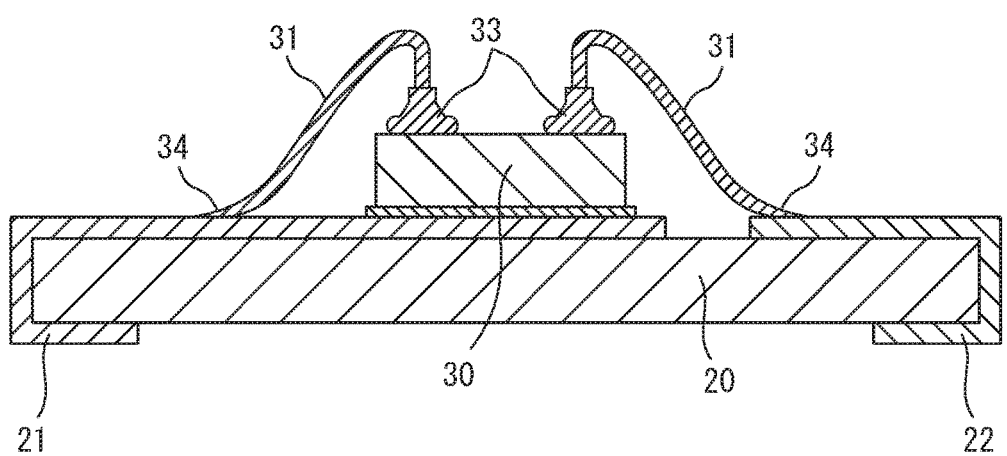
FIG. 5B is a vertical cross-sectional view corresponding to FIG. 5A.
Figure 6A:
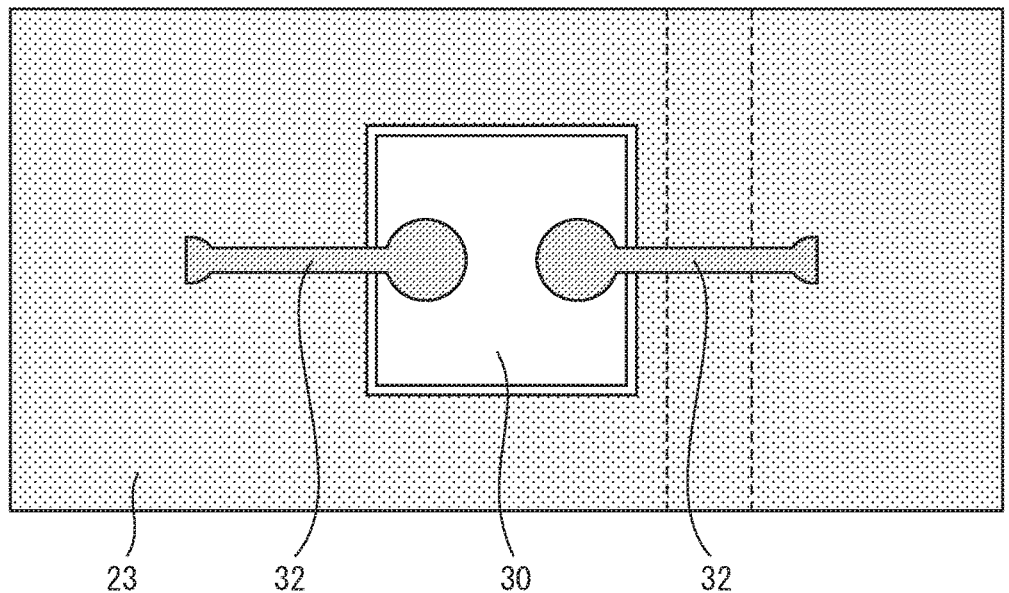
FIG. 6A is a top view illustrating steps of producing the LED package 2.
Figure 6B:
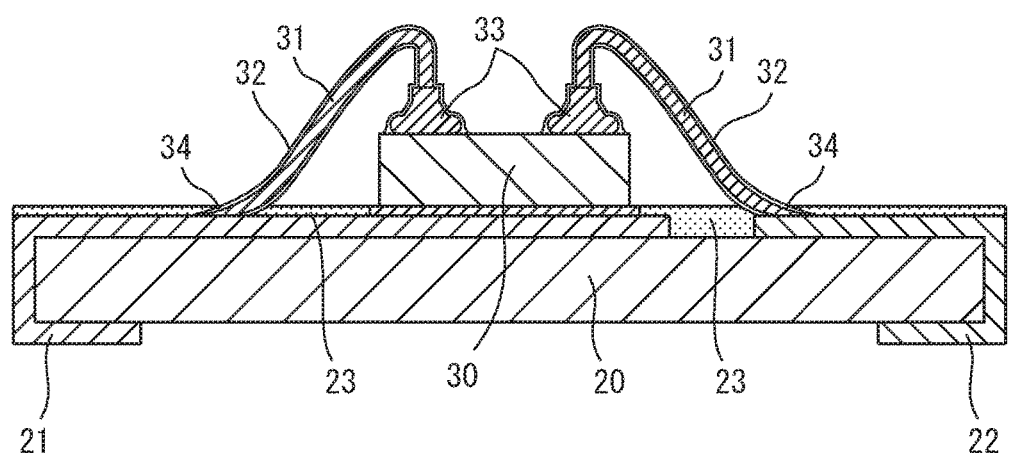
FIG. 6B is a vertical cross-sectional view corresponding to FIG. 6A.

FIGS. 5A and 6A are top views illustrating steps of producing the LED package 2. FIGS. 5B and 6B are vertical cross-sectional views corresponding to FIGS. 5A and 6A, respectively.

When the LED package 2 is produced, the LED element 30 is first mounted on the upper surface of the board 20 having the connection electrodes 21 and 22. Next, as illustrated in FIGS. 5A and 5B, the two element electrodes of the LED element 30 and the connection electrodes 21 and 22 are connected by the two wires 31 at the connection portions 33 and 34.

Subsequently, as illustrated in FIGS. 6A and 6B, the covering layer 32 and the board-covering layer 23 are formed on the surface of the two wires 31 and on the upper surface of the board 20, respectively, by using, for example, a red phosphor or a resin containing a red phosphor. The board-covering layer 23 and the cowering layer 32 are formed after wire bonding, because their formation before the bonding causes their melting during the bonding.

Then, the LED element 30, the wires 31, and the covering layer 32 are integrally sealed with the sealing resin 40 containing a yellow phosphor dispersed and mixed therein, and thereby the LED package 2 illustrated in FIG. 4 is completed.

As described above, the material of the wires 31 used for the LED packages 1 and 2 is not limited to gold and may be sliver, copper, aluminum, or the like. However, silver, for example, is a material which is easily corroded, and therefore, when wires made of silver (silver wires) are used as the wires 31, a protective layer may be provided around the wires 31 in order to prevent them from corrosion. Accordingly, in what follows, there will be described a bonding wire having a protective layer (anticorrosive wire) in addition to the above-described covering layer 32.

Figure 7A:
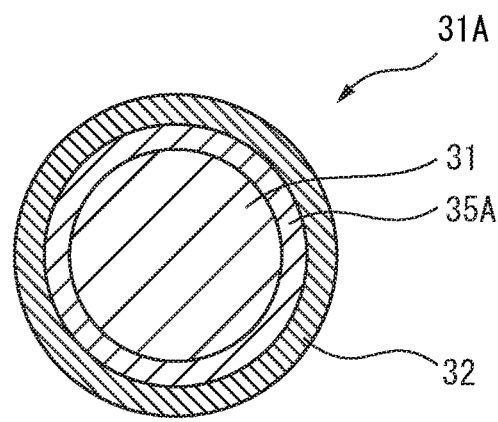
FIG. 7A is a cross-sectional view of an anticorrosive wire 31A having a protective layer 35A.

FIG. 7A is a cross-sectional view of an anticorrosive wire 31A having a protective layer 35A. The anticorrosive wire 31A includes a wire 31 which is a silver wire, the protective layer 35A covering the surface of the wire 31, and a covering layer 32 covering the surface of the protective layer 35A. The protective layer 35A is a thin film made of, for example, silicon dioxide ($SiO_2$), and serves to prevent the wire 31 from corrosion. Well known anticorrosive agents for preventing metal surfaces from corrosion can also be used for the material of the protective layer 35A. The covering layer 32 is, for example, a phosphor layer made of a red phosphor or a phosphor-containing resin layer composed of a resin containing a red phosphor, as described above.

Figure 7B:
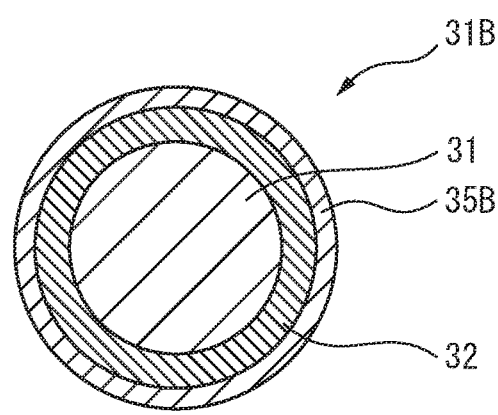
FIG. 7B is a cross-sectional view of another anticorrosive wire 31B having a protective layer 35B.

FIG. 7B is a cross-sectional view of another anticorrosive wire 31B having a protective layer 35B. The anticorrosive wire 31B includes a wire 31 which is a silver wire, a covering layer 32 covering the surface of the wire 31, and an anticorrosive protective layer 35B covering the surface of the covering layer 32. In other words, in the anticorrosive wire 31B, the covering order of the covering layer and the protective layer is reverse to that in the anticorrosive wire 31A. As in the case of the protective layer 35A, the protective layer 35B is a thin film made of, for example, silicon dioxide ($SiO_2$). As in the case of the anticorrosion wire 31B, the protective layer may be provided on the surface of the covering layer 32 (the phosphor layer or the phosphor-containing resin layer) provided on the surface of the wire 31, rather than provided directly on the surface of the wire 31. In the case of the anticorrosive wire 31B, the red phosphor in the covering layer 32 is in direct contact with the wire 31, and therefore, there is an advantage that heat generated by the phosphor easily escapes to the outside of the LED package through the wire 31.

Figure 7C:
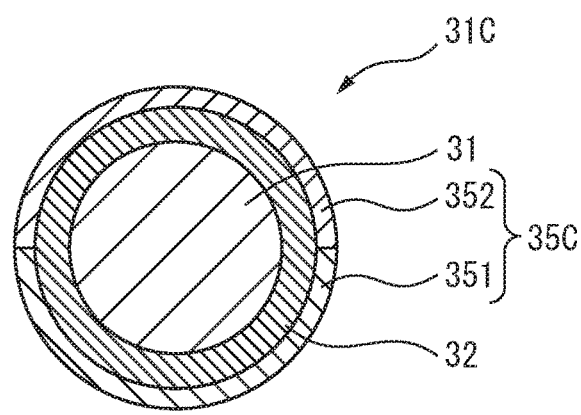
FIG. 7C is a cross-sectional view of yet another anticorrosive wire 31O having a protective layer 35C.

FIG. 7C is a cross-sectional view of yet another anticorrosive wire 31C having a protective layer 35C. Like the anticorrosive wire 31B, the anticorrosive wire 31C includes a wire 31 which is a silver wire, a covering layer 32 covering the surface of the wire 31, and an anticorrosive protective layer 35C covering the surface of the covering layer 32. However, the protective layer 35C is different from the protective layers 35A and 35B in that it has a lower portion 351 and an upper portion 352 made of materials having different refractive indices. The lower portion 351 is approximately a half of the protective layer 35C and is a closer side to the board 10 or 20 of the LED package using the anticorrosive wire 31C and to the LED element 30, and the portion is made of a material having a low refractive index than the sealing resin 40 of the LED package. On the other hand, the upper portion 352 is approximately a half of the protective layer 35C and is a farther side from the board 10 or 20 and the LED element 30, and the portion is made of a material having the same refractive index as that of the sealing resin 40, for example.

In the anticorrosive wire 31C, since the lower portion 351 of the protective layer 35C is made of a layer having a low refractive index, some or light emitted downward from the red phosphor in the covering layer 32 is totally reflected on the surface of the protective layer 35C. Therefore, the anticorrosive wire 31C has an advantage, in addition to the anticorrosive effect, to decrease light traveling from the covering layer 32 to the LED element 30 thereunder and to increase light emitted in an upward direction from the LED package. Any one of the anticorrosive wires 31A to 31C illustrated in FIGS. 7A to 7C may be used as the wires 31 of the LED packages 1 and 2.

The preceding description is merely to illustrate and describe exemplary embodiments of the present invention. It is not intended to be exhaustive or limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, the invention is not limited to the particular embodiment disclosed as the best mode contemplated for carrying out this invention, but the invention includes all embodiments falling within the scope of the claims. The invention may be practiced otherwise than is specifically explained and illustrated without departing from its spirit or scope.

What is claimed is:

1. An LED package comprising:
  a board comprising a pair of connection electrodes formed thereon;
  an LED element mounted on the board;
  a bonding wire made of silver and electrically connecting the LED element to the pair of connection electrodes;
  a protective layer which is made of silicon dioxide, wherein the protective layer covers a surface of the bonding wire and protects the bonding wire from corrosion; and
  a covering layer containing a phosphor and covering the bonding wire and the protective layer,
  wherein the phosphor is excited by emitted light from the LED element to emit light having an absorbance in the bonding wire lower than that of the emitted light and a wavelength longer than that of the emitted light.

2. The LED package according to claim 1, further comprising a sealing resin which contains a second phosphor excited by the emitted light to emit second light, and which integrally seals the LED element, the bonding wire, and the covering layer,
  wherein the phosphor in the covering layer emits light having a wavelength longer than that of the second light.

3. The LED package according to claim 2, further comprising a board-covering layer which contains a third phosphor and covers a conductive pattern on the board,
  wherein the third phosphor is excited by the emitted light to emit light having an absorbance in the conductive pattern lower than that of the emitted light and a wavelength longer than those of the emitted light and the second light.

4. The LED package according to claim 1, wherein
  the LED element is an element emitting blue light as the emitted light,
  and
  the phosphor in the covering layer is a phosphor emitting red light.

5. An LED package comprising:
  a board comprising a pair of connection electrodes formed thereon;
  an LED element mounted on the board;
  a bonding wire electrically connecting the LED element to the pair of connection electrodes;
  a covering layer containing a first phosphor and covering the bonding wire, wherein the first phosphor is excited by emitted light from the LED element to emit light having an absorbance in the bonding wire lower than that of the emitted light and a wavelength longer than that of the emitted light;

a protective layer which covers a surface of the covering layer and protects the bonding wire from corrosion; and a sealing resin which contains a second phosphor excited by the emitted light to emit second light, and which integrally seals the LED element, the boning wire, the covering layer and the protective layer, wherein the first phosphor emits light having a wavelength longer than that of the second light, and a lower half portion of the protective layer, closer to the board and the LED element, is made of a material having a refractive index lower than that of the sealing resin.

6. An LED package comprising:

a board comprising a pair of connection electrodes formed thereon;

an LED element mounted on the board;

a bonding wire made of silver and electrically connecting the LED element to the pair of connection electrodes;

a covering layer containing a phosphor and covering the bonding wire; and a protective layer which is made of silicon dioxide, wherein the protective layer covers a surface of the covering layer and protects the bonding wire from corrosion, wherein the phosphor is excited by emitted light from the LED element to emit light having an absorbance in the bonding wire lower than that of the emitted light and a wavelength longer than that of the emitted light.

7. The LED package according to claim 5, further comprising a board-covering layer which contains a third phosphor and covers a conductive pattern on the board, wherein the third phosphor is excited by the emitted light to emit light having an absorbance in the conductive pattern lower than that of the emitted light and a wavelength longer than those of the emitted light and the second light.

8. The LED package according to claim 5, wherein the LED element is an element emitting blue light as the emitted light, the bonding wire is a gold wire made of gold, and the first phosphor is a phosphor emitting red light.

9. The LED package according to claim 6, further comprising a sealing resin which contains a second phosphor excited by the emitted light to emit second light, and which integrally seals the LED element, the bonding wire, and the covering layer, wherein the phosphor in the covering layer emits light having a wavelength longer than that of the second light.

10. The LED package according to claim 9, further comprising a board-covering layer which contains a third phosphor and covers a conductive pattern on the board, wherein the third phosphor is excited by the emitted light to emit light having an absorbance in the conductive pattern lower than that of the emitted light and a wavelength longer than those of the emitted light and the second light.

11. The LED package according to claim 6, wherein the LED element is an element emitting blue light as the emitted light, and the phosphor in the covering layer is a phosphor emitting red light.

\* \* \* \* \*